United States Patent [19]

Hodgson et al.

[11] 4,354,198

[45] Oct. 12, 1982

[54] ZINC-SULPHIDE CAPPING LAYER FOR GALLIUM-ARSENIDE DEVICE

[75] Inventors: Rodney T. Hodgson, Ossining; George D. Pettit, Mahopac; Thomas O. Sedgwick, Briarcliff; Jerry M. Woodall, Bedford Hills, all of N.Y.

[73] Assignee: International Business Machines Corporation, Armonk, N.Y.

[21] Appl. No.: 154,700

[22] Filed: May 30, 1980

[51] Int. Cl.$^3$ .............................................. H01L 29/161
[52] U.S. Cl. ........................................ 357/16; 357/30; 357/52
[58] Field of Search .............................. 357/16, 52, 30

[56] References Cited

U.S. PATENT DOCUMENTS

| | | | |
|---|---|---|---|
| 3,982,265 | 9/1976 | Johnston, Jr. | 357/16 X |
| 3,988,172 | 10/1976 | Bachmann | 357/16 X |
| 4,095,011 | 6/1978 | Hawrylo et al. | 428/469 |
| 4,108,684 | 8/1978 | Zanio | 357/16 X |

OTHER PUBLICATIONS

"A Technique for the Growth of Single Crystal Films of Zinc Sulphide on (100) Gallium Arsenide" by P. L. Jones et al.
Journal of Physics E: Scientific Instruments, pp. 312-316, vol. 9, No. 4, Apr. 1976.
"Laser Annealing of Bi-implanted ZnTe" by A. Bontemps, et al, in Applied Physics Letter, pp. 542-544, 36(7), Apr. 1980.

*Primary Examiner*—Martin H. Edlow
*Attorney, Agent, or Firm*—Bernard N. Wiener; Yen S. Yee

[57] ABSTRACT

The disclosure provides for the use of a group II-VI compound semiconductor as a surface passivator to control recombination of charge carriers at the surface of a group III-V compound semiconductor by a localized heating step. It is theorized for practice of the invention that the control of the recombination of the charge carriers is achieved by chemical reaction of the II-VI compound with excess group V element. In particular the disclosure provides for the use of a capping layer of laser annealed ZnS as a passivating layer on a GaAs device.

2 Claims, 2 Drawing Figures

ZINC-SULPHIDE CAPPING LAYER FOR GALLIUM-ARSENIDE DEVICE

BACKGROUND OF THE INVENTION

It is known that surface states on a GaAs device can trap minority carriers and degrade device characteristics.

The surfaces of GaAs devices must be passivated before they are useful since the minority carriers are trapped by the surface states and recombine. The surface is conventionally passivated with an epitaxially grown layer of GaAlAs which is lattice matched to the GaAs and stops the minority carrier diffusion to the GaAlAs surface.

In the background prior art, U.S. Pat. No. 4,058,413 by Welch et al., shows the use of sputtered AlN for passivation; and U.S. Pat. No. 3,705,059 by Kun, shows the use of layers containing constituents useful in later heat treating steps.

The photoluminescent properties of GaAs have been extensively studied in the past. Most of these studies have dealt with attempts to associate a variety of optical transitions with a corresponding variety of dopants and defects in GaAs. In these previous studies, it was found that the variation of short circuit current with excitation photon energy provided information about minority diffusion lengths, and interface and surface recombination velocities.

SUMMARY OF THE INVENTION

It is an object to this invention to provide for use of each of the group II–VI compound semiconductors to control recombination of charge carriers at the surface of each of the III–V compound semiconductors.

It is another object of this invention to provide for a capping layer of ZnS as a passivating layer of GaAs.

It is another object of the invention to provide a less expensive and different way to passivate the surface of a GaAs device than known in the prior practice.

The invention provides for the use of a group II–Vi compound semiconductor as a surface passivator to control recombination of charge carriers at the surface of a group III–V compound semiconductor by a localized heating step. It is theorized for practice of the invention that the control of the recombination of the charge carriers is achieved by chemical reaction of the II–VI compound with excess group V element.

PRACTICE OF THE INVENTION

Practice of the invention provides a ZnS capping layer for a GaAs device. A ZnS film is deposited onto the GaAs surface, and heated, e.g., with a laser beam. The surface recombination lifetime increases as measured by the fluorescence or photoluminescence of the GaAs.

Figure 1:
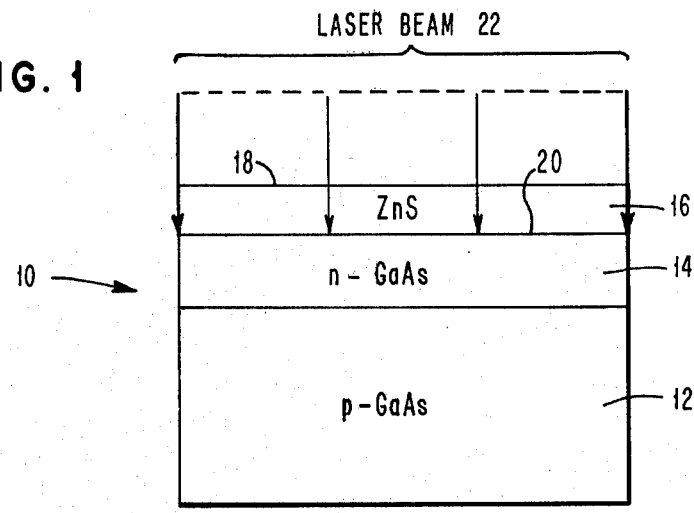
FIG. 1 shows an elevation view of an embodiment of the invention which comprises an n-GaAs surface on p-GaAs with an annealed ZnS passivating layer thereon.

An exemplary device through the practice of this invention is shown in FIG. 1. Device 10 comprises a base 12 of p-GaAs, a layer 14 of n-GaAs, and a layer 16 of ZnS with surface 18 deposited on layer 14, at interface 20, e.g., by sputtering. After the ZnS layer 16 is deposited, it is annealed, e.g., by laser beam 22.

An advantage of localized heating of the zinc-sulfide layer by laser beam is that the transparency of zinc-sulfide layer 16 to laser beam 22 can facilitate localized heating at interface 20 using pulsed lasers or continuous lasers for laser beam 22. Further, if ZnS layer 16 is not directly heated by laser beam 22, it is another advantage that the interface 22 can be driven to higher temperatures. In contrast, with equilibrium thermal annealing the zinc-sulfide 16 tends to evaporate away at surface 18 if the temperature gets too high at the surface.

ZnS is essentially transparent to a laser beam of energy approximately in the range 1.5 eV to 2.2 eV. An exemplary laser beam of said energy range can readily be produced by an He-Ne laser.

Figure 2:
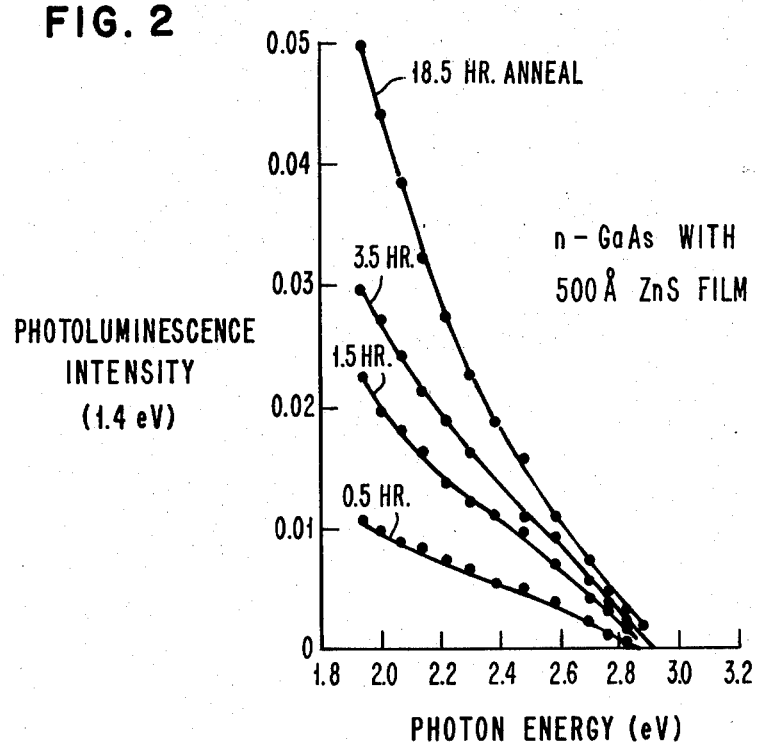
FIG. 2 shows the photoluminescence intensity vs. photon energy for an n-GaAs surface coated with a 500-Å sputtered ZnS film where the example was annealed in $H_2$ at 500° C. for the times indicated.

FIG. 2 shows the photoluminescence intensity vs. photon energy for an n-GaAs surface coated with a 500-Å sputtered ZnS film where the example was annealed in $H_2$ at 500° C. for the times indicated.

EXAMPLES FOR THE INVENTION

Sputtered ZnS film on n-type GaAs was studied using GaAs band edge photoluminescence intensity technique. The photoluminescence response increases with annealing time at 500° C. in $H_2$. It is theorized that changes both in $S_1$ and in $L_p$ are occurring, where $S_i$ is interface recombination velocity and $L_p$ is carrier diffusion length.

The photoluminescence excitation (spectral response) measurements were performed at 300° K. on examples of GaAs grown by liquid phase epitaxy. The excitation source used was a 75-Watt Xe arc lamp with a 0.25-meter scanning grating monochromator. The spectral width of this combination varied from 0.05 eV at 3.20 eV to 0.02 eV at 2 eV. The example excitation area was approximately 2×2 mm. The emitted radiation was collected and detected by a second 0.25-meter grating monochromator fitted with a cooled photomultiplier. Standard mechanical chopping of the beam and lock-in amplification provided adequate sensitivity for the noted measurements. The photoluminescence excitation results are normalized in FIG. 2 for constant incident photon flux. For comparative measurements of the photoluminescence output in both short circuit and open circuit modes, a mesa etched sample (A=0.2 cm²) was uniformly excited by an Ar laser (λ=514 nanometers) with a maximum incident power of 60 milliwatts. The emitted radiation was collected at normal incidence from the example surface with f/8 optics and focused on the spectrometer slit.

THEORY FOR THE INVENTION

It is theorized for the practice of this invention: that the ZnS capping layer 16 reacts with the surface 20 of the n-GaAs 14, presumably with excess As combining to form Zn As; and that the surface chemistry may be written as

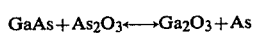

$$GaAs + As_2O_3 \leftarrow\rightarrow Ga_2O_3 + As$$

where the $As_2O_3$ or As has harmful effects. Thus, if the reaction is driven to the right, by eliminating the As, the surface conditions can be changed and the carrier lifetime at the surface increased.

Having thus described our invention, what we claim as new, and desire to secure by Letters Patent is:

1. A semiconductor device body of a group III-V semiconductor having at least one surface with a first lattice structure, and a group II-VI semiconductor having a second lattice structure different from said first lattice structure in an annealed condition on said at least one surface functioning as a passivating layer for said body.

2. A semiconductor device body as set forth in claim 1 wherein said III-V semiconductor in GaAs and said II-VI semiconductor is ZnS.

* * * * *